United States Patent
Herr (10) Patent No.: US 10,243,582 B1
(45) Date of Patent: Mar. 26, 2019

(54) INTERFACING BETWEEN SFQ AND NRZ DATA ENCODINGS

(71) Applicant: Quentin P. Herr, Ellicott City, MD (US)

(72) Inventor: Quentin P. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/937,418

(22) Filed: Mar. 27, 2018

(51) Int. Cl.
| H03M 5/06 | (2006.01) |
| H03M 5/02 | (2006.01) |
| G06N 99/00 | (2019.01) |
| H03K 19/195 | (2006.01) |

(52) U.S. Cl.
CPC ............ *H03M 5/02* (2013.01); *G06N 99/002* (2013.01); *H03K 19/195* (2013.01)

(58) Field of Classification Search
CPC .............................. H03M 5/02; H03K 19/195
USPC ..................................................... 341/55–70
See application file for complete search history.

(56) References Cited

U.S. PATENT DOCUMENTS

| | | | |
|---|---|---|---|
| 5,963,351 A * | 10/1999 | Kaplounenko | H03L 7/24 329/346 |
| 6,331,805 B1 * | 12/2001 | Gupta | H03B 15/00 327/528 |
| 6,864,005 B2 * | 3/2005 | Mossman | H01M 8/04119 429/414 |
| 7,724,020 B2 | 5/2010 | Herr | |
| 7,724,083 B2 | 5/2010 | Herr et al. | |
| 7,772,871 B2 * | 8/2010 | Herr | H03K 3/38 326/4 |
| 7,782,077 B2 * | 8/2010 | Herr | B82Y 10/00 326/4 |
| 7,786,748 B1 | 8/2010 | Herr | |
| 9,646,682 B1 * | 5/2017 | Miller | G11C 11/44 |
| 9,779,803 B1 * | 10/2017 | Konigsburg | G11C 11/44 |
| 9,876,505 B1 * | 1/2018 | Dai | G06N 99/002 |
| 10,090,841 B1 * | 10/2018 | Herr | H03K 19/1954 |
| 2010/0033252 A1 * | 2/2010 | Herr | H03F 3/605 330/286 |
| 2017/0017742 A1 * | 1/2017 | Oberg | G06F 17/5031 |
| 2018/0145664 A1 * | 5/2018 | Herr | H01L 39/025 |

OTHER PUBLICATIONS

Herr: "A High-Efficiency Superconductor Distributed Amplifier"; Published Jan. 21, 2010 • IOP Publishing Ltd; Superconductor Science and Technology, vol. 23, No. 2.

Herr, et al.: "Ultra-Low-Power Superconductor Logic"; Journal of Applied Physics 109, 103903 (2011); Published Online: May 2011; https://doi.org/10.1063/1.3585849.

* cited by examiner

*Primary Examiner* — Lam T Mai
(74) *Attorney, Agent, or Firm* — Tarolli, Sundheim, Covell & Tummino LLP (57) ABSTRACT

Superconducting interface circuits and methods convert between non-return-to-zero (NRZ) encoded voltage signals and reciprocal quantum logic (RQL) compliant signals of opposite-polarity single flux quantum (SFQ) pulse pairs, and vice-versa, so as to provide high-speed NRZ input to, and output from, RQL computing circuitry.

20 Claims, 8 Drawing Sheets

INTERFACING BETWEEN SFQ AND NRZ DATA ENCODINGS

GOVERNMENT INTEREST

The invention was made under Government Contract Number H94003-04-D-0004-0215. Therefore, the US Government has rights to the invention as specified in that contract.

TECHNICAL FIELD

This disclosure relates generally to superconducting circuits, and specifically to interfacing between circuits using single flux quantum (SFQ) data encodings and those using non-return-to-zero (NRZ) data encodings.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. In some implementations, as an alternative to CMOS technology, single flux quantum (SFQ) circuitry utilizes superconducting Josephson junctions (JJs), with typical signal power of around 4 nanowatts (nW), at a typical data rate of 20 gigabits per second (Gb/s) or greater, and operating temperatures of around 4 kelvins.

Return-to-zero (RZ) encoding describes the encoding of digital logic values as one of two values in a voltage signal such that the voltage level in the signal always returns to a low value after presenting a high value (representing a logical "1," e.g.), even when the signal is representative of successive high values. In non-return-to-zero (NRZ) encoding, by contrast, successive logical high values are represented as a voltage signal that, aside from any negligible glitches that are more or less instantaneous, remains high until a logical low value is presented in the signal to bring the signal voltage level back to its low value. Superconducting systems in pertinent implementations of the reciprocal quantum logic (RQL) family encode a logical high digital value as a single flux quantum (SFQ) pulse of one polarity followed, within about a half a clock cycle, by a resetting SFQ pulse of the opposite polarity (e.g., a positive SFQ pulse followed by a negative SFQ pulse). A logical low digital value is encoded as the absence of an SFQ pulse.

SUMMARY

One example includes superconducting interface circuitry for converting non-return-to-zero (NRZ) encoded voltage signals to reciprocal quantum logic (RQL) compliant signals of opposite-polarity single flux quantum (SFQ) pulse pairs. The interface circuitry includes three Josephson transmission lines (JTLs). An input JTL is configured to convert a input voltage level of one of two binary states to an SFQ pulse. A reflecting JTL, connected to the input JTL, is configured to reflect and invert the SFQ pulse as an inverted SFQ pulse. An output JTL, connected to the input JTL and the reflecting JTL, is configured to transmit as an RQL-encoded output signal the SFQ pulse and, subsequently, the inverted SFQ pulse, as an opposite-polarity SFQ pulse pair.

Another example includes superconducting interface circuitry for converting RQL-compliant signals of opposite-polarity SFQ pulse pairs to NRZ-encoded voltage signals. The interface circuitry includes inversion and delay circuitry and current-controlled voltage source circuitry. The inversion and delay circuitry is configured to receive an input signal of SFQ pulses, to invert the polarity of the input signal, and to delay the input signal (the latter two in either order), so as to provide an inverted and delayed signal. The current-controlled voltage source circuitry is configured to receive and combine the input signal and the inverted and delayed signal to produce an NRZ-encoded output voltage signal.

Yet another example includes a method for converting NRZ-encoded voltage signals to RQL-compliant signals of opposite-polarity SFQ pulse pairs. A first transition in an NRZ-encoded input voltage signal is converted to an SFQ pulse. The SFQ pulse is reflected to generate an inverted SFQ pulse. A pulse pair comprising the inverted SFQ pulse following the SFQ pulse is provided within same clock cycle as an output signal. The reflection and pulse pair provision are repeated until the occurrence of a second transition, opposite from the first transition, in the input signal.

Still another example includes a method of converting RQL-compliant signals of opposite-polarity SFQ pulse pairs to NRZ-encoded voltage signals. An RQL-encoded input signal consisting of opposite-polarity SFQ pulse pairs is inverted and delayed (in no particular order). An output voltage level is restored by the inverted and delayed signal at substantially the same time as the input signal causes the output voltage level to transition between binary states. The restoring of the output voltage level is repeated until the input signal ceases to consist of SFQ pulse pairs for at least one clock cycle.

Still yet another example includes a superconducting computing system that includes input superconducting circuitry configured to convert NRZ-encoded input voltage signals to RQL-compliant signals of opposite-polarity SFQ pulse pairs; RQL circuitry configured to perform computations using, at least in part, the RQL-compliant signals to produce result signals that are also RQL-compliant signals of opposite-polarity SFQ pulse pairs; and output superconducting circuitry configured to convert the result signals to NRZ-encoded output voltage signals.

DETAILED DESCRIPTION

This disclosure relates generally to logical circuits for use in reciprocal quantum logic (RQL) systems and related methods. This disclosure more specifically relates to circuits and methods for interfacing between systems using single flux quantum (SFQ) and non-return-to-zero (NRZ) data encodings, such as are commonly used by CMOS-based serializers and deserializers. Transmission rates that are limited either by semiconductor electronics or by interconnect bandwidths can be increased by a factor of two using NRZ encoding versus using return-to-zero (RZ) encoding. Thus, circuits and methods herein provide appropriate SFQ input to, and NRZ output from, reciprocal quantum logic (RQL) systems that rely on SFQ pulses for logic encoding and signal transmission and interface with NRZ-based systems. RQL circuits of the type described herein using NRZ-encoded inputs and outputs have been fabricated and measured to operate in the range of between 2 and 12 gigabits per second.

Figure 1A:
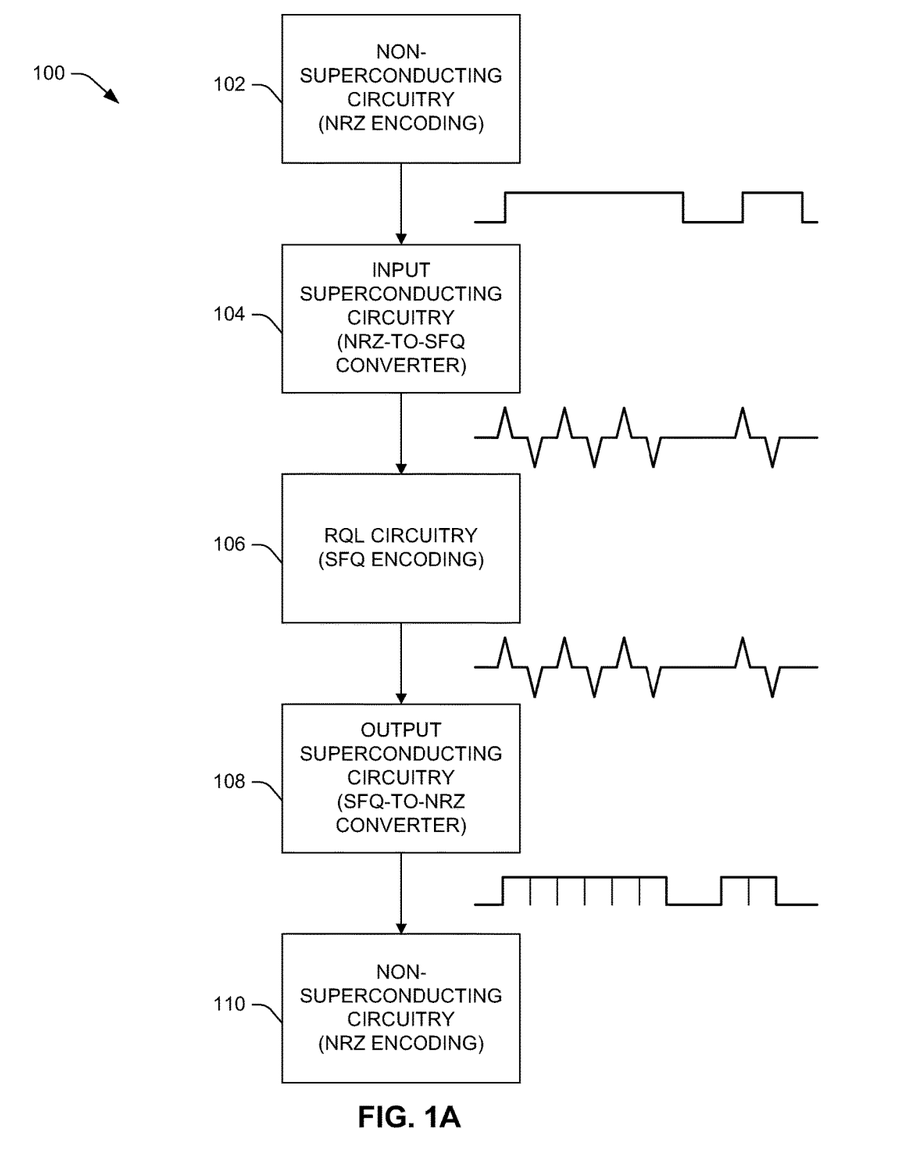
FIG. 1A is a system block diagram of an example superconducting computing system that computes using single flux quantum (SFQ) encoded signals but inputs and outputs non-return-to-zero (NRZ) encoded voltage signals.

FIG. 1A shows an example superconducting computing system 100 using encoding interface circuitry 104, 108 as described herein. In system 100, non-superconducting circuitry 102, 110, which may operate at or around room temperature, uses NRZ encoding for its signals (e.g., data signals), which is an encoding standard for room-temperature electronics. By contrast, RQL circuitry 106, which can perform computational processing at superconducting speeds (e.g., microwave-frequency clock speeds) and may be kept at cryogenic temperatures, uses SFQ encoding for its signals (e.g., data signals). Input superconducting circuitry 104 converts NRZ encoded signals (e.g., data), to encoding that uses pairs of SFQ pulses, which is an encoding standard used by RQL superconductor logic, as in circuitry 106. Output superconducting circuitry 108 converts RQL encoded signals back to NRZ encoding for use with non-superconducting circuitry 110, which may be the same or different circuitry as circuitry 102, and/or may be part of the same room-temperature system as circuitry 102. The superconducting circuitry shown in FIG. 1A and otherwise described herein can be implemented, for example, on a chip, alone or along with other superconducting circuitry, and operated, for example, at cryogenic temperatures.

Figure 1B:
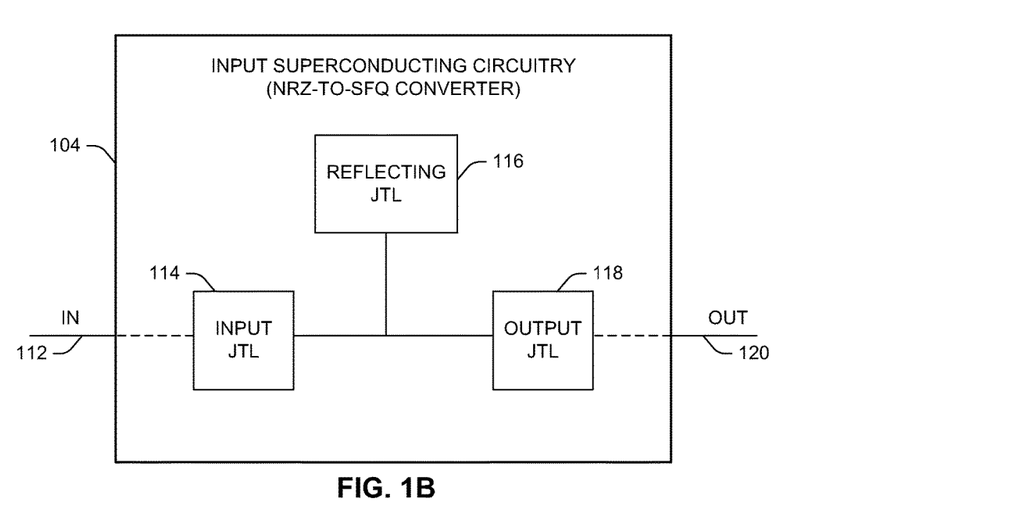
FIG. 1B is a block diagram of example input superconducting interface circuitry that can be used in the superconducting computing system of FIG. 1A.

FIG. 1B is a block diagram of input superconducting circuitry 104 as may be used in system 100 of FIG. 1A to convert NRZ-encoded voltage signals to RQL-compliant signals of opposite-polarity SFQ pulse pairs. NRZ-to-SFQ converter 104 can consist of input line 112, three Josephson transmission lines (JTLs) 114, 116, and 118, and output line 120. Input JTL 114 is configured to convert a voltage level provided via input line 112, e.g., through a transformer coupling, into an input SFQ pulse. Reflecting JTL 116 is configured to reflect the input SFQ pulse provided via input JTL 114, e.g., by connecting reflecting JTL to ground via an inductor, and/or by appropriate sizing of components in reflecting JTL 116. The reflected pulse provided by reflecting JTL 116 is inverted in polarity from the provided input pulse, and can serve to reset the input JTL 114. Output JTL is configured to convey the input SFQ pulse and, subsequently, the reflected, inverted SFQ pulse, through output line 120.

Figure 1C:
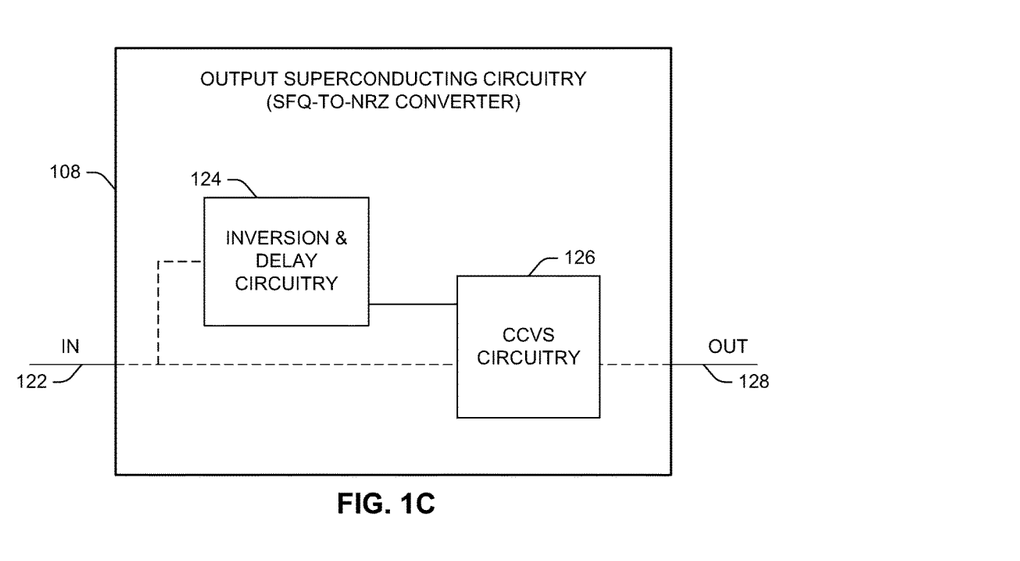
FIG. 1C is a block diagram of example output superconducting interface circuitry that can be used in the superconducting computing system of FIG. 1A.

FIG. 1C is a block diagram of output superconducting circuitry 108 as may be used in system 100 of FIG. 1A to convert RQL-compliant signals of opposite-polarity SFQ pulse pairs to NRZ-encoded voltage signals. Input line 122 can be configured to receive RQL-compliant signals of SFQ pulse pairs and subsequently provide these input signals to both inversion and delay circuitry 124 and current-controlled voltage source (CCVS) circuitry 126. Inversion and delay circuitry 124 is configured to polarity-invert and delay (e.g., by one-half clock cycle) the input RQL signal, and further to provide the inverted and delayed signal to CCVS circuitry 126, e.g., to an opposite side of CCVS circuitry 126 than the side of circuitry 126 to which the input signal is provided. CCVS circuitry 126 is configured to appropriately combine the input signal and the inverted and delayed signal so as to produce an NRZ-encoded output voltage signal to output line 128. CCVS circuitry 126 can include, for example, a superconducting quantum interference device (SQUID), or multiple SQUIDs in a stacked configuration.

Figure 2A:
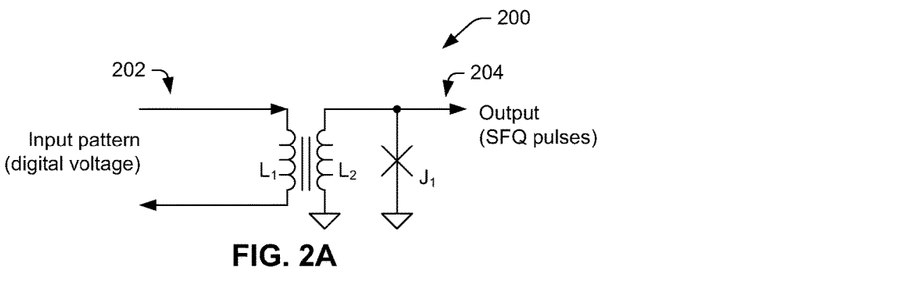
FIG. 2A is a circuit diagram of example return-to-zero (RZ) to SFQ interface circuitry.
Figure 2B:
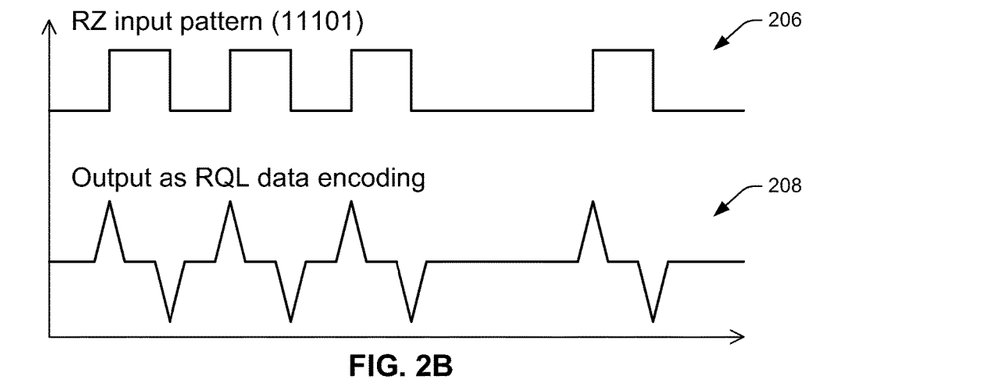
FIG. 2B is a graph of input and output plots for an example RZ binary input pattern, the RQL-encoded output as produced by the circuitry of FIG. 2A.
Figure 2C:
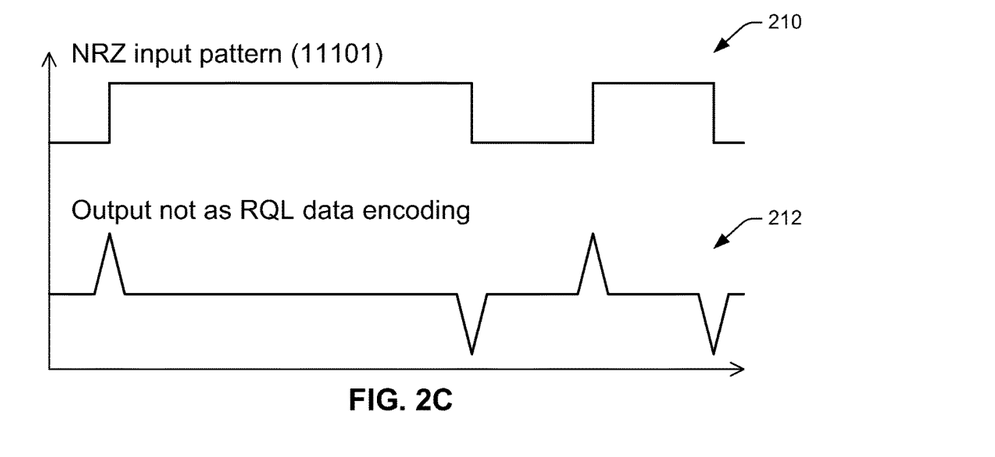
FIG. 2C is a graph of input and output plots for an example NRZ binary input pattern, the output as produced by the circuitry of FIG. 2A.

FIG. 2A illustrates an example input superconducting circuit 200 capable of converting RZ encoding to RQL-compliant encoding but not of converting NRZ encoding to RQL-compliant encoding. Circuit 200 includes input line 202, transformer-coupled inductors $L_1$, $L_2$, Josephson junction $J_1$, and output line 204. Circuit 200 is level-triggered, meaning that when current provided to input line 202 goes above a threshold, Josephson junction $J_1$ produces a positive SFQ pulse, and when the input current goes back down, Josephson junction $J_1$ produces a negative SFQ pulse. An input pattern is presented to the input line 202 as a digital voltage signal, and corresponding SFQ pulses are produced at the output 204. In the illustrated example, RQL-encoded data consists of a positive-and-negative pulse pair to encode a logical "1," and no pulses to encode a logical "0." Although the examples set forth in this disclosure conform to one set of polarity conventions, it is understood that other examples can use an opposite set of signal polarity conventions. As shown in FIG. 2B, which illustrates an RZ input pattern 206 corresponding to the digital signal "11101" and resultant output signal 208 encoded as a series of positive and negative SFQ pulses, circuit 200 produces a positive SFQ pulse on the rising edge of the pattern and a negative SFQ pulse on the falling edge. Although an RZ input, such as input pattern 206, produces the correctly RQL-encoded SFQ pulse encoded output, such as output pattern 208, an NRZ input, such as input pattern 210 in FIG. 2C, results in output SFQ pulses that will not exhibit the desired RQL data encoding, having each positive pulse succeeded by a negative pulse within the same clock cycle. FIG. 2C shows faulty RQL data encoding output 212 generated by circuit 200 given NRZ input pattern 210 for the same digital signal ("11101").

Figure 3A:
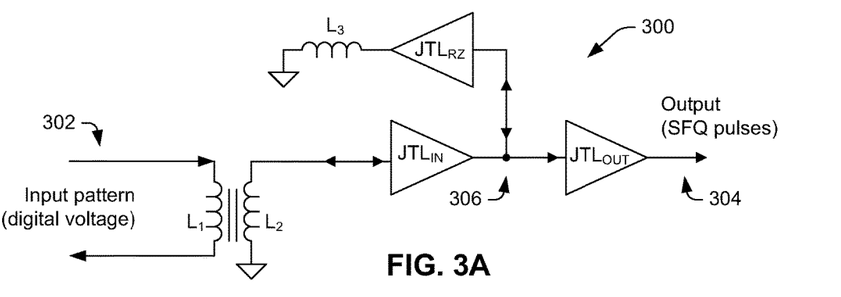
FIG. 3A is a circuit diagram of example NRZ-to-SFQ interface circuitry.

FIG. 3A illustrates an input circuit 300 that can correspond to circuitry 104 in FIG. 1A. Like circuit 200 of FIG. 2A, circuit 300 includes input line 302, transformer-coupled inductors $L_1$, $L_2$, and output line 304. Additionally, circuit 300 includes a branched-JTL stage consisting of three Josephson transmission lines $JTL_{IN}$, $JTL_{OUT}$, $JTL_{RZ}$, and inductor $L_3$ to ground. The branched-JTL stage is implemented as a splitter with one branch shorted to ground, causing SFQ signal reflection, whereby a negative pulse is generated after every positive pulse in the branch. Bidirectional signals in the splitter network are shown in FIG. 3A as bidirectional arrows.

Like circuit 200 of FIG. 2A, circuit 300 produces a positive SFQ pulse in response to a superthreshold input voltage, which positive SFQ pulse propagates from input Josephson transmission line $JTL_{IN}$ to output Josephson transmission line $JTL_{OUT}$ and out of output 304. However, this positive SFQ pulse also propagates through the split at node 306 into return-to-zero Josephson transmission line $JTL_{RZ}$, where it travels through inductor $L_3$ to ground and gets temporarily stored as an SFQ of persistent current. Half a clock cycle later, the stored pulse comes back out of return-to-zero Josephson transmission line $JTL_{RZ}$ as a negative pulse. The behavior of active return-to-zero Josephson transmission line $JTL_{RZ}$ is like that of a passive transmission line terminated with a short, in that an input positive voltage pulse inverts as it reflects from the termination and returns as a negative voltage pulse. Unlike with a passive transmission line, however, the effect is not a free-running resonance; the back-and-forth behavior completes the circuit once every clock cycle.

Figure 3B:
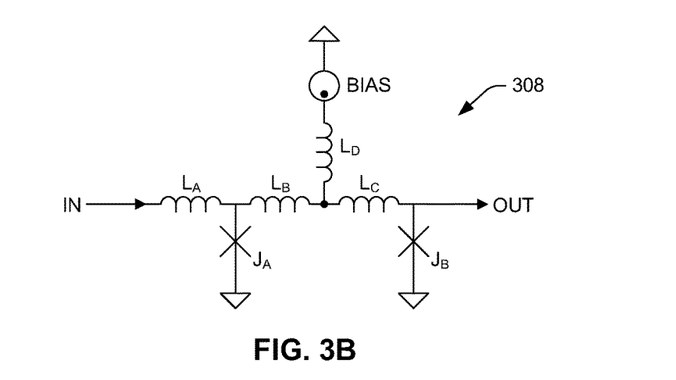
FIG. 3B is a circuit diagram of an example Josephson transmission line (JTL) structure that can be used in the NRZ-to-SFQ interface circuitry of FIG. 3A.

FIG. 3B shows an example JTL structure 308 that can be used for each Josephson transmission line $JTL_{IN}$, $JTL_{OUT}$, $JTL_{RZ}$ shown in FIG. 3A. The structure 308 has nominal input IN, feeding into inductor $L_4$, and nominal output OUT. The component sizings may be chosen so as to enforce bidirectional signal flow, which is particularly important for Josephson transmission lines $JTL_{IN}$ and $JTL_{RZ}$. As an example, input and output Josephson transmission lines $JTL_{IN}$ and $JTL_{OUT}$ can have the first Josephson junction $J_A$ sized to have a critical current of about 35 µA and the second Josephson junction $J_B$ sized to have a critical current of about 50 µA, the relative proportions of which values facilitate splitting: a 35 µA junction can drive a 50 µA junction, the 50 µA junction can drive two 35 µA junctions in parallel, permitting a binary tree that steps up by √2 as it fans out. As an example, return-to-zero Josephson transmission line $JTL_{RZ}$ can have both its Josephson junctions $J_A$ and $J_B$ sized to have critical currents of about 35 µA. In other examples in which return-to-zero Josephson transmission line $JTL_{RZ}$ has Josephson junctions of mismatched sizes, circuit performance is improved in arrangements having the smaller of the two Josephson junctions closer to node 306. An RQL clock, e.g., a 4-phase AC RQL clock, can be used to bias each JTL, as represented by AC current source BIAS in circuit 308.

Figure 3C:
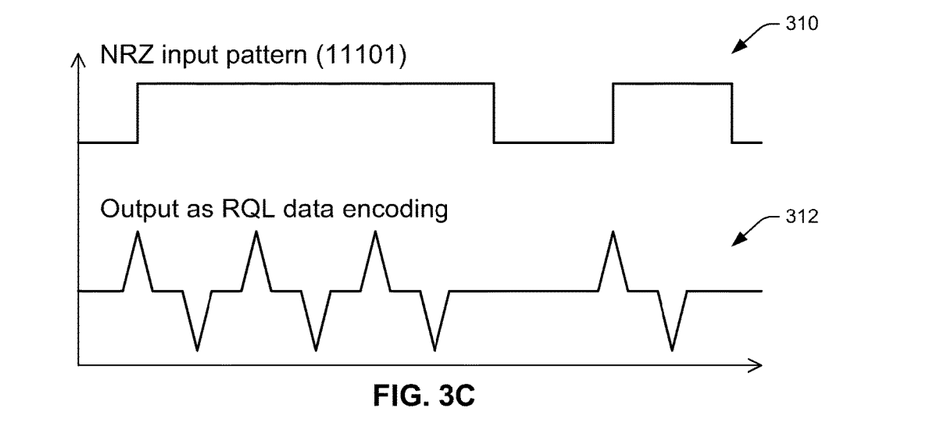
FIG. 3C is a graph of input and output plots for an example NRZ binary input pattern, the RQL-encoded output as produced by the circuitry of FIG. 3A.

Emerging from return-to-zero Josephson transmission line $JTL_{RZ}$ into node 306, the reflected and inverted pulse goes to the output 304 via output Josephson transmission line $JTL_{OUT}$ and also resets the input Josephson transmission line $JTL_{IN}$, permitting it to fire again so long as the input voltage pattern remains high (i.e., superthreshold). The branched-JTL stage of circuit 300 thereby produces a negative SFQ pulse at output 304 one-half clock cycle after every positive SFQ pulse, which resets circuit 300 and enables a positive SFQ pulse to be produced every clock cycle that the input 302 remains high. A corresponding low pulse is always provided to the output 304 in response to a high input pulse regardless of when the NRZ input pattern has a falling edge. As can be seen in the plots of FIG. 3C, circuit 300 thus converts NRZ input pattern 310 into properly encoded RQL signal 312.

Figure 4A:
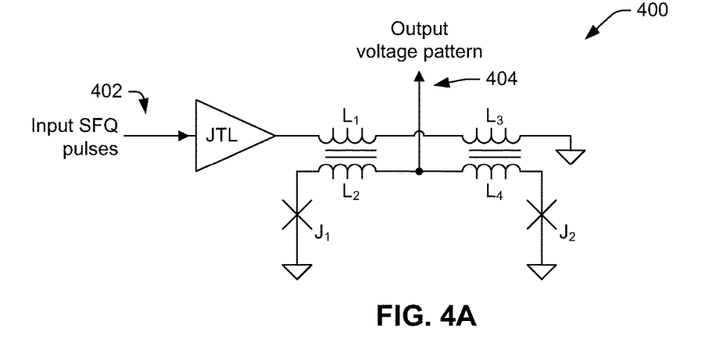
FIG. 4A is a circuit diagram of example SFQ-to-RZ interface circuitry.
Figure 4B:
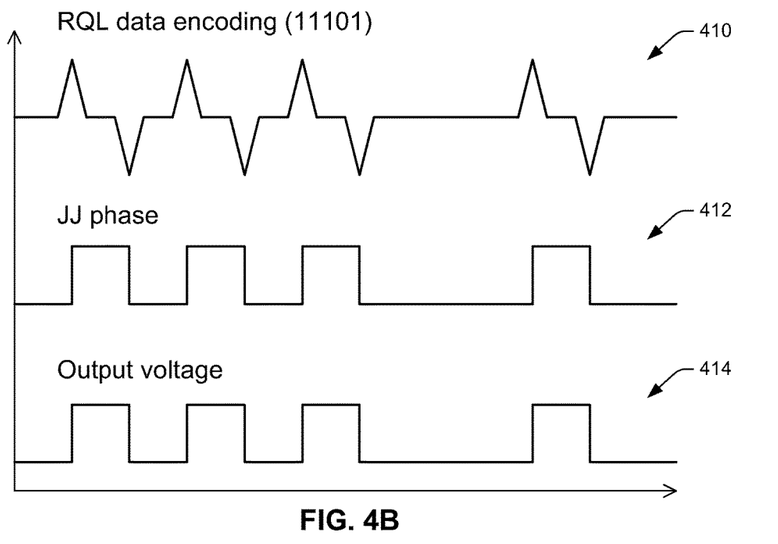
FIG. 4B is a graph of input and output plots for an example RQL input pattern, the RZ-encoded output as produced by the circuitry of FIG. 4A.

FIG. 4A illustrates an example output circuit 400 that converts Josephson junction superconducting phase to output voltage, where Josephson junction superconducting phase is defined as the integral of the SFQ voltage pulse. In the illustrated example, a current-controlled voltage source is made up of a single-output SQUID, consisting of Josephson junction $J_1$, inductor $L_2$, inductor $L_4$, and Josephson junction $J_2$, but the current-controlled voltage source can also be provided as a stacked design to provide a desired amount of amplification as described in U.S. Pat. No. 7,724,083 B2, which is herein incorporated by reference. Circuit 400 thus converts RQL data encoding provided via input line 402 to an RZ pattern output at output line 404. FIG. 4B shows an example input signal 410 consisting of SFQ pulses to form a "11101" pattern and corresponding JJ phase 412 and output voltage signal 414 having an RZ pattern. As noted previously, an NRZ pattern is desired in some cases; circuit 400, however, is not capable of producing an NRZ output pattern.

Figure 5A:
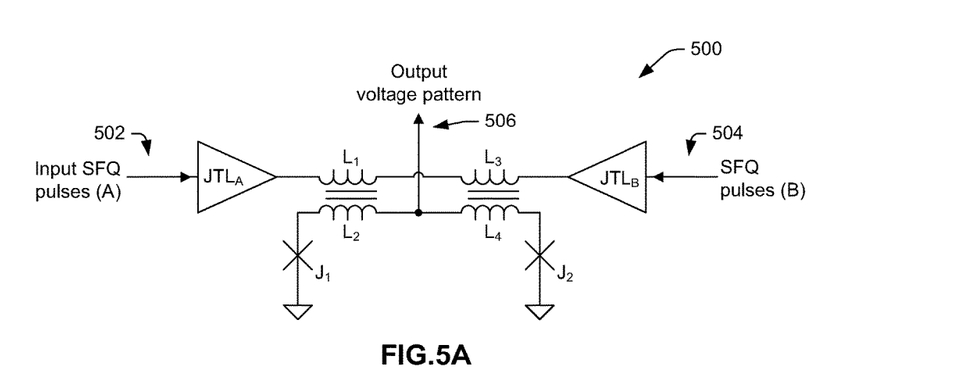
FIG. 5A is a circuit diagram of example SFQ-to-NRZ interface circuitry.

FIG. 5A illustrates an example output circuit 500 that can correspond to circuitry 108 in FIG. 1A. Circuit 500 differs from circuit 400 in that it feeds the current-controlled voltage source with an input pulse train ("Signal A") on one side and a delayed and inverted copy ("Signal B") of the same pulse train on the other side. As illustrated, the Signal A pulse train is supplied at the left side of the circuit via first input line 502 and the Signal B pulse train is supplied at the right side of the circuit via second input line 504. An output voltage pattern is delivered via output line 506. A negative SFQ pulse is pushed in through Josephson transmission line $JTL_A$ by Signal A half a clock cycle after Signal A pushes in a positive SFQ pulse from the left side of circuit 500. This negative SFQ pulse would have the effect of bringing the output voltage low, like with the function of RZ-encoding circuit 400, except that the delayed and inverted Signal B pulse pushed in from the right side of circuit 500 through Josephson transmission line $JTL_B$ restores the high output voltage at substantially the same time. Any slight timing difference between the effects of Signal A and Signal B may introduce negligible glitches to the output signal, illustrated in FIG. 5B as thin vertical lines.

Figure 5B:
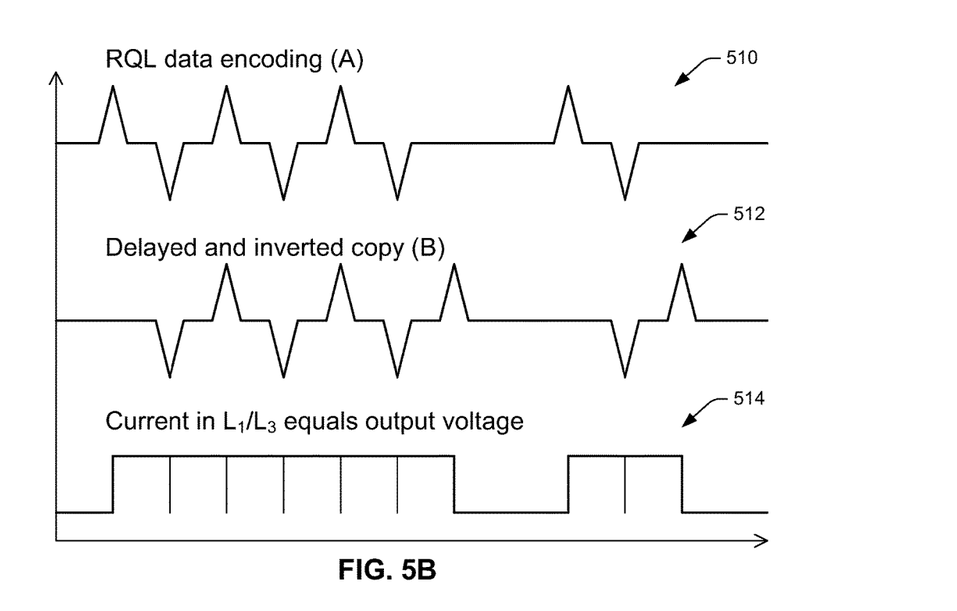
FIG. 5B is a graph of input and output plots for an example RQL input pattern, the NRZ-encoded output as produced by the circuitry of FIG. 5A.

As shown in FIG. 5B, delayed and inverted copy Signal B, plotted as SFQ pulse signal 512, is delayed by one-half clock cycle from RQL-encoded input Signal A, plotted as signal 510. Current produced by the SFQ pulses in the primary inductors $L_1/L_3$, including glitches, is converted to voltage at the output 506 by the output SQUID, which includes Josephson junctions $J_1$ and $J_2$ and transformer inductors $L_2$ and $L_4$, and is shown as output voltage signal 514. The final, positive pulse of Signal B, which does not have a mate in Signal A, causes the output to finally go low in FIG. 5B by restoring the initial, no-current-in-the-inductor state. The circuit 500 thus converts RQL-encoded data into an NRZ output pattern. As noted with respect to circuit 400, although the current-controlled voltage source in circuit 500 is illustrated as a single SQUID, other example designs based on circuit 500 can implement stacked-SQUID current-controlled voltage sources, while still achieving the same encoding conversion functionality of circuit 500.

Figure 6A:
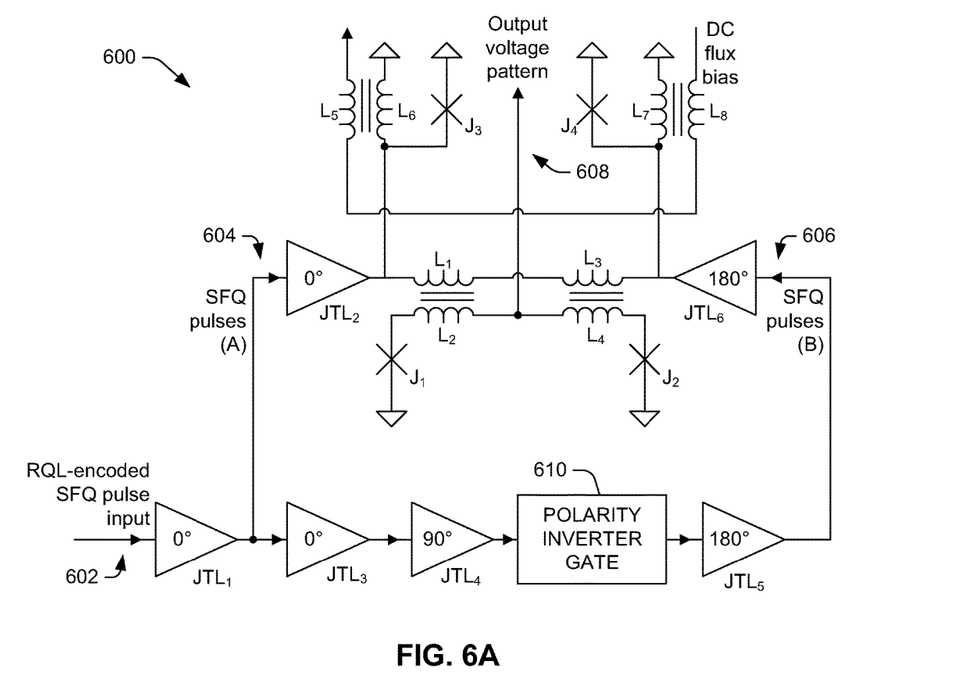
FIG. 6A is a circuit diagram of example SFQ-to-NRZ interface circuitry.

FIG. 6A illustrates another example output circuit 600 that functions like circuit 500 to convert an RQL-encoded input of SFQ pulses, provided at input line 602, to NRZ-encoded voltage pattern delivered at output line 608, by delaying and inverting an input signal ("Signal A") to provide a second signal ("Signal B"). Circuit 600 as illustrated includes the same SQUID arrangement as circuits 400 and 500, but, as described above, can also use a stacked-SQUID arrangement as a current-controlled voltage source. Circuit 600 uses Josephson transmission lines $JTL_4$ and $JTL_5$ to incur the time delay required to transform Signal A into Signal B. For example, Josephson transmission lines $JTL_4$ and $JTL_5$ can collectively incur one-half clock cycle (i.e., 180°) of delay. For example, each of Josephson transmission lines $JTL_4$ and $JTL_5$ can incur one-quarter clock cycle (i.e., 90°) of delay. JTL delay can be implemented by the phasing of the RQL AC clock. The total delay of the input signal at various points in circuit 600 is given in degrees within the various JTL symbols in FIG. 6A. Thus, in the illustrated example, Josephson transmission lines $JTL_1$, $JTL_2$, $JTL_3$, and $JTL_6$ provide no delay, such that an undelayed version of the input signal is provided to the left side of the current-controlled voltage source as Signal A, while a 180° delayed version of the input signal is provided to the right side of the current-controlled voltage source as Signal B.

Figure 6B:
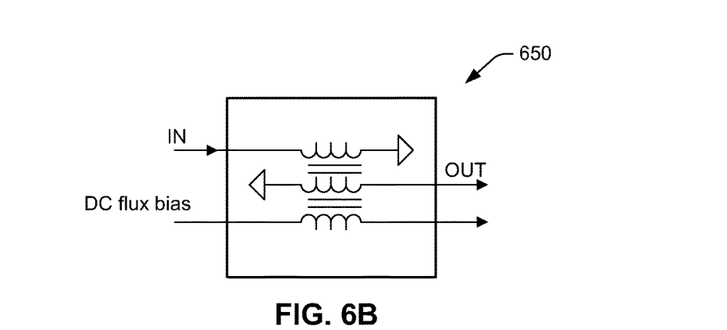
FIG. 6B is a diagram of an example polarity inverter gate as can be used in the SFQ-to-NRZ interface circuitry of FIG. 6A.

In circuit 600, the polarity inversion described above with regard to circuit 500 is accomplished with polarity inverter gate 610. FIG. 6B illustrates an example polarity inverter gate 650 that can be used for gate 610 in FIG. 6A, comprising a counter-wound transformer. Flux bias on the transformer can be used to create symmetry between positive and negative pulses. When inverter gate design 650 is used as gate 610, the leading inductor on $JTL_5$ of FIG. 6A can be incorporated into the polarity inverter gate 610. Other polarity inverter gate designs, such as those described in U.S. Pat. No. 10,090,841, entitled "Josephson Polarity and Logical Inverter Gates," may also be used for gate 610 in circuit 600.

In circuit 600, the flux biases applied to Josephson transmission lines $JTL_5$ and $JTL_6$ are of negative polarity relative to the other JTLs, because $JTL_5$ and $JTL_6$ generate the negative SFQ pulse before the positive pulse. $JTL_2$ and $JTL_6$, which drive the primary inductor $L_1/L_3$ at the output, can also be connected respectively to inductors $L_6$ and $L_7$ that go to ground and have flux bias applied, via transformer-coupled inductors $L_5$ and $L_8$, respectively, on a DC flux bias line. Inductors $L_6$ and $L_7$ can be arranged in parallel with Josephson junctions $J_3$ and $J_4$, respectively. This arrangement assists in creating symmetry between positive and negative pulses.

Figure 7A:
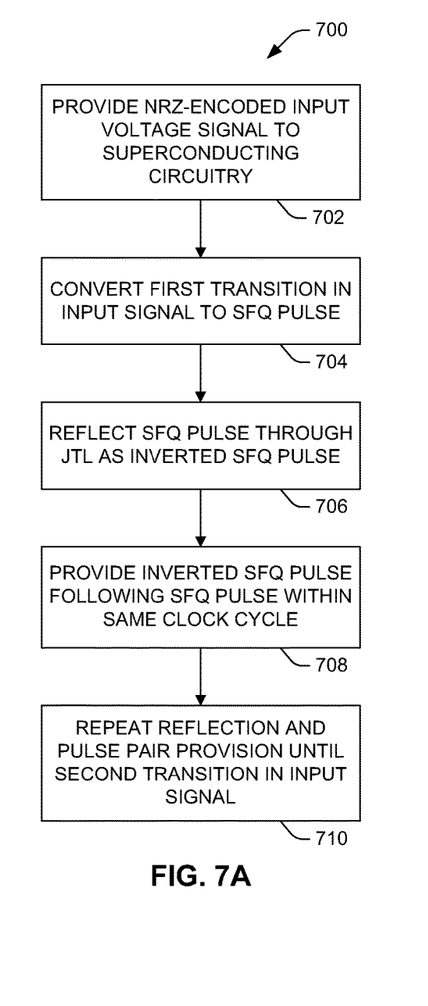
FIG. 7A is a flow diagram of a method for converting NRZ-encoded voltage signals to RQL-compliant signals of opposite-polarity SFQ pulse pairs.

FIG. 7A illustrates a method 700 of converting NRZ-encoded signals to RQL-encoded signals for use in superconducting circuits. An NRZ-encoded input voltage signal is provided 702 to superconducting circuitry. A first voltage-level transition (e.g., a low-to-high transition) in the input signal is converted 704 to an SFQ pulse. The SFQ pulse is then reflected 706 through a JTL, e.g., a JTL connected to ground via an inductor, as shown in circuit 300 in FIG. 3, as an inverted SFQ pulse. This inverted SFQ pulse is then provided 708, following the (original) SFQ pulse, within the same cycle, e.g., to superconducting-speed RQL processing circuitry, like circuitry 106 in FIG. 1A. The reflection 706 and pulse pair provision 708 is repeated 708 until a second transition, opposite from the first transition (e.g., from a high voltage to a low voltage), in the input signal, at which point the reflection and provision ceases and no SFQ pulses are provided. Thereby, provision of correctly encoded RQL signals is achieved based on NRZ-encoded signal input.

Figure 7B:
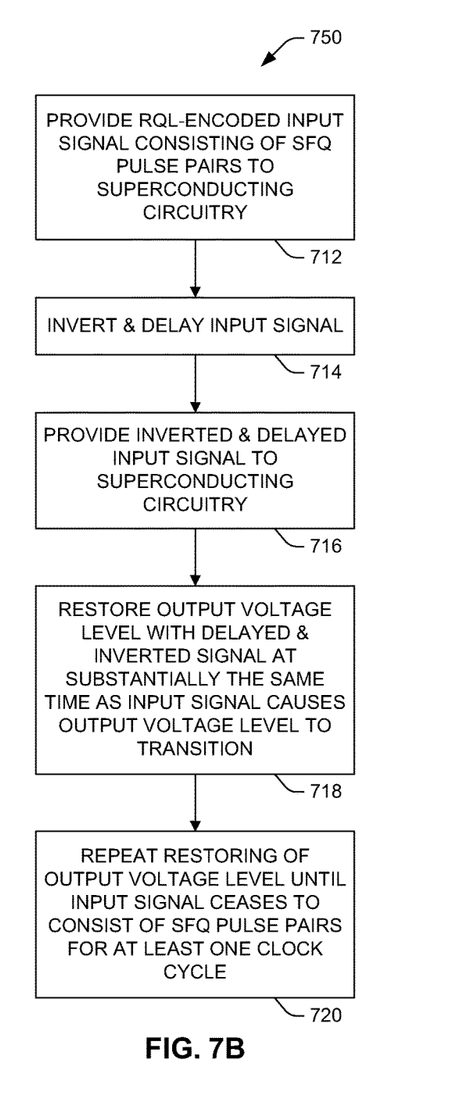
FIG. 7B is flow diagram of a method of converting RQL-compliant signals of opposite-polarity SFQ pulse pairs to NRZ-encoded voltage signals.

FIG. 7B illustrates a method 750 of converting RQL-encoded signals used in superconducting circuits to NRZ-encoded signals. An RQL-encoded input signal consisting of SFQ pulse pairs (e.g., one pulse pair per clock cycle) is provided 712 to superconducting circuitry. The input signal is inverted and delayed (irrespective of the order in which these are done) 714 and provided 716 to the superconducting circuitry, e.g., to an opposite side of the circuitry from the side to which the input signal is provided 712. The superconducting circuitry in method 750 can, for example, consist of a current-controlled voltage source, such as can be constructed of a SQUID or stacked SQUIDS, as described above with respect to circuits 500 and 600 shown in FIGS. 5A and 6A, respectively, for example. An output voltage level is restored 718 (e.g., to remain high) by provision 716 of the delayed and inverted signal at substantially the same time as the provision 712 of the input signal causes the output voltage level to transition (e.g., from high to low). This restoring 718 of the output voltage level is repeated 720 until the input signal ceases to consist of SFQ pulse pairs for at least one clock cycle. The momentary "silencing" of the SFQ pulse pairs in the RQL-encoded input signal means that the output voltage level should properly transition (e.g., go from high to low) in accordance with the RQL-to-NRZ conversion scheme. The clock cycle length can be defined, for example, as the time between the starts of immediately successive RQL-encoded SFQ pulse pairs in the input signal (e.g., the time between the starts of two logical "F" s in a row).

Some phase-mode logic (PML) implementations of RQL circuitry operate on a encoding scheme different from the RQL encoding scheme used herein, which does not require the resetting pulse. This disclosure pertains primarily to RQL implementations that do make use of resetting pulses in the encoding scheme.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. Superconducting interface circuitry for converting non-return-to-zero (NRZ) encoded voltage signals to reciprocal quantum logic (RQL) compliant signals of opposite-polarity single flux quantum (SFQ) pulse pairs, the circuitry comprising:
    an input Josephson transmission line (JTL) configured to convert an input voltage level of one of two binary states to an SFQ pulse;

a reflecting JTL, connected to the input JTL, configured to reflect and invert the SFQ pulse as an inverted SFQ pulse; and an output JTL, connected to the input JTL and the reflecting JTL, configured to transmit as an RQL-encoded output signal the SFQ pulse and, subsequently, the inverted SFQ pulse, as an opposite-polarity SFQ pulse pair.

2. The interface circuitry of claim 1, wherein the circuitry is configured to reflect the inverted SFQ pulse into the input JTL to reset the input JTL.

3. The interface circuitry of claim 1, wherein the circuitry is configured to transmit the inverted SFQ pulse from the output JTL within the same clock cycle as the SFQ pulse.

4. The interface circuitry of claim 3, wherein the circuitry is configured to transmit the inverted SFQ pulse from the output JTL one half clock cycle later than the SFQ pulse.

5. The interface circuitry of claim 1, wherein the reflecting JTL is connected to ground via an inductor.

6. The interface circuitry of claim 1, wherein the circuitry is configured to successively transmit opposite-polarity pulse pairs, one pair per clock cycle, as long as the input voltage level remains the one of two binary states.

7. The interface circuitry of claim 1, wherein the reflecting JTL comprises exactly two Josephson junctions each sized to have a critical current of about 35 microamps.

8. The interface circuitry of claim 1, wherein at least one of the input JTL and the output JTL comprises exactly two Josephson junctions, one of the Josephson junctions being sized to have a critical current of about 35 microamps and the other of the Josephson junctions being sized to have a critical current of about 50 microamps.

9. The interface circuitry of claim 1, wherein each of the three JTLs is biased by an RQL clock signal.

10. A superconducting computing system comprising:
the interface circuitry of claim 1;
RQL circuitry configured to perform computation using, at least in part, the RQL-compliant signals, to produce RQL-compliant result signals comprising opposite-polarity SFQ pulse pairs; and
output superconducting circuitry configured to convert the RQL-compliant result signals to NRZ-encoded output voltage signals.

11. Superconducting interface circuitry for converting reciprocal quantum logic (RQL) compliant signals of opposite-polarity single flux quantum (SFQ) pulse pairs to non-return-to-zero (NRZ) encoded voltage signals, the circuitry comprising:
inversion and delay circuitry configured to receive an input signal of SFQ pulses and to provide an inverted and delayed signal by at least one of:
inverting the polarity of the input signal and delaying the inverted signal, or
delaying the input signal and inverting the polarity of the delayed signal; and
current-controlled voltage source circuitry configured to receive and combine the input signal and the inverted and delayed signal to produce an NRZ-encoded output voltage signal.

12. The interface circuitry of claim 11, wherein the inversion and delay circuitry comprises one or more Josephson transmission lines (JTLs) configured to incur delay to at least one of the input signal or an inverted version of the input signal, and a polarity inverter gate configured to invert SFQ pulses.

13. The interface circuitry of claim 12, wherein the polarity inverter gate comprises a counter-wound transformer configured to receive a DC flux bias via an inductive coupling.

14. The interface circuitry of claim 12, wherein the one or more JTLs are configured to collectively incur one-half clock cycle of delay.

15. A superconducting computing system comprising the interface circuitry of claim 11, RQL circuitry configured to perform computation to produce the RQL-compliant signals and using, at least in part, RQL-compliant input signals comprising opposite-polarity SFQ pulse pairs, and input superconducting circuitry configured to convert NRZ-encoded input voltage signals to the RQL-compliant input signals.

16. A method comprising:
converting a first transition in a non-return-to-zero (NRZ) encoded input voltage signal to a single flux quantum (SFQ) pulse;
reflecting the SFQ pulse to generate an inverted SFQ pulse;
providing a pulse pair comprising the inverted SFQ pulse following the SFQ pulse within same clock cycle as an output signal; and
repeating the reflection and pulse pair provision until a second transition, opposite from the first transition, in the input signal.

17. The method of claim 16, wherein the first voltage-level transition is from a low voltage to a high voltage.

18. The method of claim 17, wherein the pulse pair consists of a positive SFQ pulse followed by a negative SFQ pulse one half clock cycle later.

19. A method comprising:
inverting and delaying a reciprocal quantum logic (RQL) encoded input signal consisting of opposite-polarity single flux quantum (SFQ) pulse pairs;
restoring a non-return-to-zero (NRZ) encoded output voltage signal level with the inverted and delayed signal at substantially the same time as the input signal causes the output voltage signal level to transition between binary states; and
repeating the restoring of the output voltage level until the input signal ceases to consist of SFQ pulse pairs for at least one clock cycle.

20. The method of claim 19, wherein the restoring comprises providing the input signal and the inverted and delayed signal to respective opposite sides of a superconducting current-controlled voltage source comprising one or more superconducting quantum interference devices (SQUIDs).

* * * * *